United States Patent
Narsale et al.

(10) Patent No.: US 10,553,278 B1
(45) Date of Patent: Feb. 4, 2020

(54) MEDIA MANAGER CACHE EVICTION TIMER FOR READS AND WRITES DURING RESISTIVITY DRIFT

(71) Applicant: Micron Technology, Inc., Boise, ID (US)

(72) Inventors: Ashay Narsale, Newark, CA (US); Robert M. Walker, Raleigh, NC (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/056,354

(22) Filed: Aug. 6, 2018

(51) Int. Cl.
*G11C 13/00* (2006.01)
*G11C 15/04* (2006.01)

(52) U.S. Cl.
CPC ........ *G11C 13/0061* (2013.01); *G11C 13/003* (2013.01); *G11C 13/004* (2013.01); *G11C 13/0004* (2013.01); *G11C 13/0069* (2013.01); *G11C 13/0097* (2013.01); *G11C 15/046* (2013.01); *G11C 2013/0045* (2013.01); *G11C 2013/0054* (2013.01); *G11C 2013/0078* (2013.01)

(58) Field of Classification Search
CPC .............. G11C 13/004; G11C 13/0069; G11C 13/0004; G11C 16/3418; G11C 16/08; G11C 16/26; G11C 13/0033; G11C 13/0061; G11C 16/3427; G11C 13/0028; G11C 13/0038; G11C 16/32
USPC ..... 365/226, 163, 148, 185.03, 185.12, 149, 365/185.11, 185.22, 185.24, 222, 227, 365/233.1
See application file for complete search history.

(56) References Cited

U.S. PATENT DOCUMENTS

2014/0006696 A1* 1/2014 Ramanujan ........ G11C 13/0004
711/103

* cited by examiner

Primary Examiner — Thong Q Le
(74) Attorney, Agent, or Firm — Nicholson De Vos Webster & Elliott LLP

(57) ABSTRACT

A method for caching memory requests while accounting for a phase change memory cell drift phenomenon is described. The method includes writing first user data to an address in phase change memory cells; setting a timer in a set of data structures to a first value in response to writing the first user data to the phase change memory cells, wherein the data structures are stored outside the phase change memory cells; determining whether the timer corresponding to the first user data has expired; and fulfilling a read request for the address from the set of data structures in response to determining that the timer has not expired.

20 Claims, 5 Drawing Sheets

| MANAGER CACHE CAM 202 | | | | | |
|---|---|---|---|---|---|
| 302₁ | ADDRESS 304₁ | VALIDITY BIT 306₁ | DIRTY BIT 308₁ | POINTER 310₁ | TIMER 312₁ |
| 302₂ | ADDRESS 304₂ | VALIDITY BIT 306₂ | DIRTY BIT 308₂ | POINTER 310₂ | TIMER 312₂ |
| 302₃ | ADDRESS 304₃ | VALIDITY BIT 306₃ | DIRTY BIT 308₃ | POINTER 310₃ | TIMER 312₃ |
| ⋮ | | | | | |
| 302ₘ | ADDRESS 304ₘ | VALIDITY BIT 306ₘ | DIRTY BIT 308ₘ | POINTER 310ₘ | TIMER 312ₘ |

| MANAGER CACHE 204 | |
|---|---|
| 314₁ | USER DATA 316₁ |
| 314₂ | USER DATA 316₂ |
| 314₃ | USER DATA 316₃ |
| ⋮ | |
| 314ₘ | USER DATA 316ₘ |

MEDIA MANAGER CACHE EVICTION TIMER FOR READS AND WRITES DURING RESISTIVITY DRIFT

TECHNICAL FIELD

The various embodiments described in this document relate to managing memory. In particular, embodiments include systems and methods for integrating a timer in a media manager cache to manage reads and writes during resistivity drift.

BACKGROUND ART

Research and development of commercially viable memory that are randomly accessed, have relatively low power consumption, and are non-volatile is ongoing. One ongoing area of research is in resistive memory cells where resistance states can be changed. One avenue of research relates to storing data in memory cells by structurally or chemically changing a physical property of the memory cells in response to applied write voltages and/or current, which in turn changes cell resistance. A controller uses a voltage read reference to detect the resistivity. An example of a variable resistance memory includes memories using phase changing glasses (e.g., chalcogenide glass). The change in physical property, or phase change, is a transition and, within a population of phase change cells, there exists a distribution of transition latencies. The tails/ends of this distribution is problematic as a clear set of read/demarcation voltages can be difficult to ascertain. Further, delaying accesses to accommodate the tails/ends of the distribution erodes the value of phase change memory (i.e., read times can be lengthened).

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
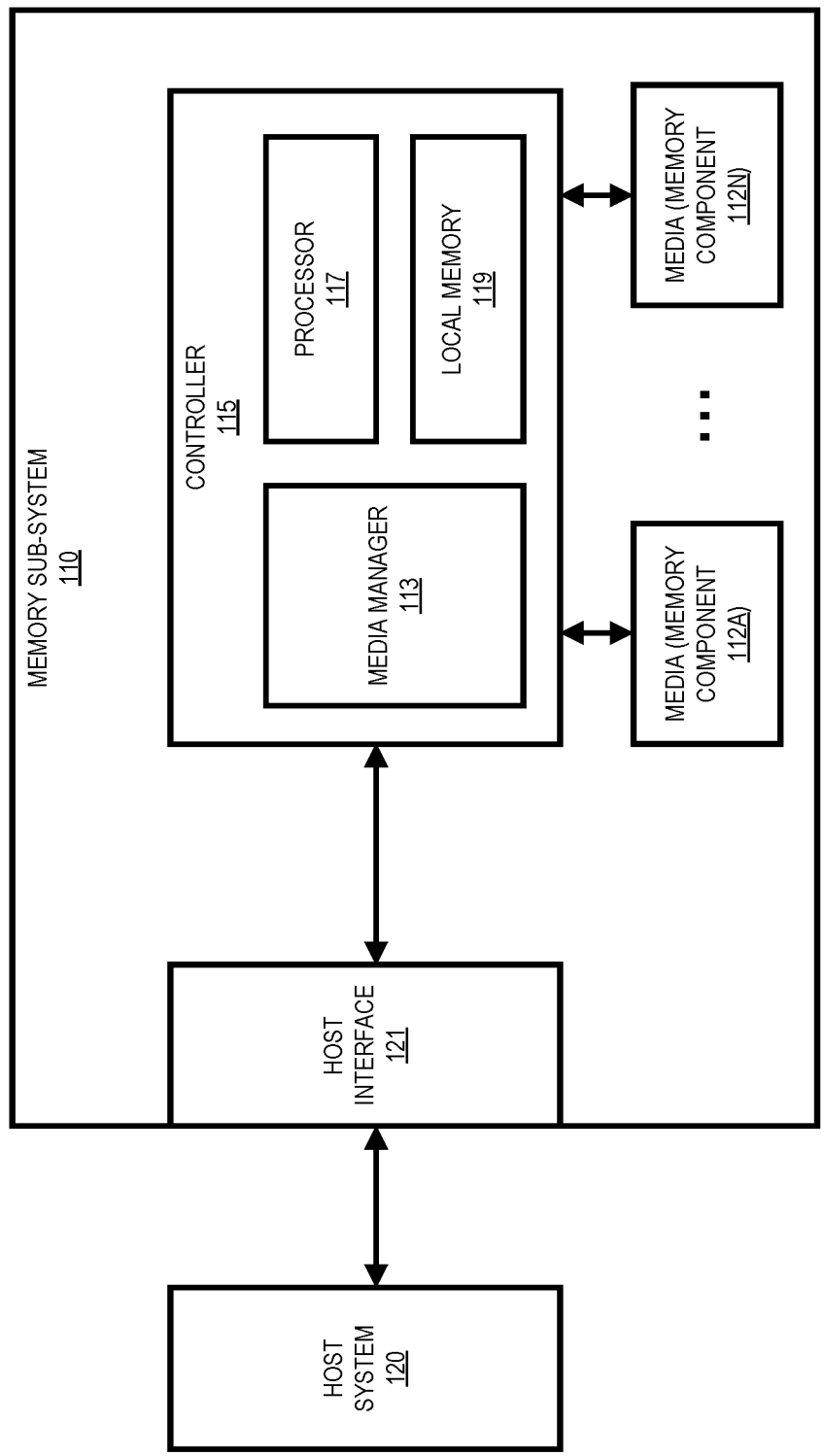
FIG. 1 illustrates an example computing environment that includes a memory sub-system, in accordance with some embodiments of the present disclosure.

Aspects of the present disclosure are directed to a media manager cache in a memory sub-system. A memory sub-system is also hereinafter referred to as a "memory device". An example of a memory sub-system is a storage system, such as a solid-state drive (SSD). In some embodiments, the memory sub-system is a hybrid memory/storage sub-system. In general, a host system can utilize a memory sub-system that includes one or more memory devices, including those that utilize phase change memory cells with variable resistance materials. The host system can provide data to be stored at the memory sub-system and can request data to be retrieved from the memory sub-system.

Although variable resistance materials of phase change memory cells are conventionally described as being in one phase or another (e.g., metastable in an amorphous phase or a crystalline phase) and having a discrete resistivity while in that corresponding phase, resistivity of variable resistance materials can in actuality be in constant transition or can be constantly drifting. Namely, the resistivity of variable resistance materials can vary (i.e., decelerate) over time as the material attempts to settle. Further, the rate of resistivity change can be dependent on the phase of the variable resistance material. For example, when a variable resistance material is in a crystalline phase (i.e., is set) the rate of resistivity change can be higher than when the variable resistance material is in the amorphous phase (i.e., is reset/unset).

Based on inconsistencies in the changing resistivity of variable resistance materials when in the amorphous and crystalline phases, determining a demarcation voltage for reading the variable resistance material is difficult and can be prone to error. This issue is particularly prevalent just after a variable resistance material has been written (e.g., zero to one-hundred milliseconds after the phase of the variable resistance material has been altered) as the resistivity of the variable resistance material is at its highest level of transition/drift. As time elapses from the time the phase change memory cell was written, using a defined demarcation voltage for reading the variable resistance material is less prone to producing a read error.

To address the above issues, some conventional systems include a set of data structures that can be used for temporarily storing user data that was recently written to variable resistance materials phase change memory cells and/or parity bits associated with the user data. Accordingly, when a read memory request is received by a memory controller corresponding to recently written variable resistance materials, data can be read from the set of data structures rather than from the variable resistance materials of the phase change memory cells. In some conventional systems, three separate memory structures are managed by a memory controller to address resistivity drift: (1) a media manager cache that stores recent write and read memory requests (e.g., requests to read user data from or write user data to memory components, including those that are implemented with phase change memory cells), (2) a drift buffer that stores user data that was recently written to phase change memory cells, and (3) a victim buffer that stores user data from the drift buffer that was recently updated/re-written. Such conventional architecture results in considerable overhead costs. Particularly, this overhead includes (1) space devoted to three separate memory structures (e.g., a media manager cache, a drift buffer, and a victim buffer) and (2) management of the three separate memory structures (e.g., movement of user data between the media manager cache and the drift buffer upon eviction from the media manager cache and between the drift buffer and the victim buffer upon eviction from the drift buffer).

To reduce the overhead costs of the above described conventional architecture, aspects of the present disclosure integrate the drift buffer and the victim buffer into a media manager cache. Aspects of the present disclosure include timers/counters that are used by the media manager cache to account for resistivity drift instead of using separate drift and victim data structures. In particular, as will be described in greater detail below, as a write request is received from a host device, the media manager cache content addressable memory (CAM) adds an entry corresponding to the write request. The entry in the media manager cache CAM includes a reference/pointer to a media manager cache where the user data of the write request is stored. The newly added entry in the media manager cache CAM includes a set dirty bit, which indicates that the user data has not been written to the phase change memory components, and a timer/timestamp or another piece of timing data, which indicates when the user data for the write request that is stored in the media manager cache is to be written to the phase change memory components. For example, a timer field of the entry in the media manager cache CAM can be set equal to the sum of the time the entry was added to the media manager cache CAM and a first preset time value (e.g., two-hundred milliseconds). Until the current time equals the timer value, memory access requests for corresponding user data stored in the media manager cache are accessed from the media manager cache instead of the phase change memory components. Further, the media manager cache CAM can monitor this timer field and, upon the current time being equal to the timer value, the media manager cache CAM transmits a write memory request to write the dirty user data stored in the media manager cache to the phase change memory components.

To account for difficulties in reading the user data recently written to the phase change memory components, the media manager cache CAM can again set the timer field of the entry. For example, the media manager cache CAM can set the timer field of the entry equal to the sum of the time the user data was written to the phase change memory components and a second preset time value (e.g., one-hundred milliseconds). In this example, memory access requests for corresponding user data are accessed from the media manager cache instead of the phase change memory components until the current time equals the timer value. In some embodiments, upon receipt of another write request to the same address before the current time equals the timer value, the media manager cache CAM updates the media manager cache and media manager cache CAM entries, including resetting the timer. Accordingly, subsequent memory access requests for corresponding user data are accessed from the media manager cache instead of the phase change memory components to account for resistivity drift and to allow for caching of memory access requests.

As described above and as will be described in greater detail below, the use of timers in the media manager cache CAM allows the integration of the drift buffer and victim buffer into the media manager cache. The integration of a drift buffer and the victim buffer in the media manager cache through the use of timer values results in a reduced number of storage spaces and consequent transfers of user data to alleviate resistivity drift issues in phase change memory cells.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a solid-state drive (SSD).

In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface 121. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface 121 include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface 121 can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface 121 can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative- and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM) (or another resistance memory component), magneto random access memory (MRAM), negative- or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include the controller 115, and can instead rely upon external control (e.g., provided by an external host, or by a processor or controller separate from the memory sub-system 110).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface 121. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a media manager 113 that can manage the memory components 112A to 112N, including drift memory management components. In some embodiments, the controller 115 includes at least a portion of the media manager 113. For example, the controller 115 can include a processor 117 (processing device) configured to execute instructions stored in local memory 119 for performing the operations described herein. In some embodiments, the media manager 113 is part of the host system 120, an application, or an operating system.

The media manager 113 can manage a media manager cache CAM and media manager cache to collectively cache read/write memory requests and buffer recent writes to the memory components 112A to 112N. Further details with regards to the operations of the media manager 113 are described below.

As noted above, the memory components 112A to 112N can be resistance memory components such that each of the memory cells that make up the memory components 112A to 112N is a resistance memory cell. For example, each memory components 112A to 112N can represent a die providing three-dimensional phase change material and switching (PCMS) memory. In such an embodiment, each of the memory cells of the memory components 112A to 112N is a phase change memory cell.

A phase change memory cell (e.g., in a memory component 112A to 112N) can be constructed over a substrate, having a variable resistance material formed between a bottom electrode and a top electrode. One type of variable resistance material can be amorphous silicon doped with V, Co, Ni, Pd, Fe and Mn. Another type of variable resistance material can include perovskite materials such as Pr(1-x)CaxMnO3 (PCMO), La(1-xCaxMnO3(LCMO), LaSrMnO3 (LSMO), or GdBaCoxOy (GBCO). Still another type of variable resistance material can be a doped chalcogenide glass of the formula AxBy, where B is selected from among S, Se and Te and mixtures thereof, and where A includes at least one element from Group III-A (B, Al, Ga, In, Tl), Group IV-A (C, Si, Ge, Sn, Pb), Group V-A (N, P, As, Sb, Bi), or Group VII-A (F, Cl, Br, I, At) of the periodic table, and with the dopant being selected from among the noble metals and transition metals, including Ag, Au, Pt, Cu, Cd, Ir, Ru, Co, Cr, Mn or Ni. Yet another type of variable resistance material includes a carbon-polymer film comprising carbon black particulates or graphite, for example, mixed into a plastic polymer. The material used to form bottom and top electrodes of phase change memory cells can be selected from a variety of conductive materials, such as tungsten, nickel, tantalum, titanium, titanium nitride, aluminum, platinum, or silver, among others.

The variable resistance material can be in an amorphous phase or a crystalline phase. The resistance of the variable resistance material is different when in the amorphous phase in comparison to when in the crystalline phase. In particular, the variable resistance material has a higher resistivity when in the amorphous phase than when in the crystalline phase. As described herein, the phase of the variable resistance material and by extension the resistivity of the variable resistance material can be equated, linked, or otherwise associated with a binary value. In one example embodiment, the amorphous phase with a first resistivity (or first resistivity range) corresponds to a binary value of "0" or False (i.e., a reset/unset state) and the crystalline phase with a second resistivity (or second resistivity range) corresponds to a binary value of "1" or True (i.e., a set state). In other embodiments, the association between phases/resistivity of the variable resistance material and binary values can be switched/flipped.

Although variable resistance materials have been described as having only two phases (e.g., an amorphous phase and a crystalline phase), in other embodiments, variable resistance materials can have more than two phases. For example, a variable resistance material can have a single amorphous phase and two crystalline phases (e.g., cubic and hexagonal crystalline phases). For purposes of explanation, the variable resistance materials used herein will be described in relation to two phases (e.g., an amorphous phase and a crystalline phase); however, the systems, methods, and devices described herein can operate similarly when the variable resistance materials have more than two phases.

The transition from one phase to another phase (e.g., from the amorphous phase to the crystalline phase or from the crystalline phase to the amorphous phase) occurs in response to temperature changes of the variable resistance material. The temperature changes (i.e., heating and cooling) can be caused by passing differing strengths of current through the variable resistance material. For example, the electrodes of the phase change memory cell can place the variable resistance material in a crystalline phase by passing a crystallizing current through the variable resistance material, thus warming the variable resistance material to a temperature wherein a crystalline structure can grow. The electrodes can use a stronger melting current to melt the variable resistance material for subsequent cooling to the amorphous phase. When the phase change memory cell uses the crystalline phase to represent a binary value of "1" or True and the amorphous phase to represent a binary value of "0" or False, the crystallizing current can be referred to as a write or set current and the melting current can be referred to as an erase or reset current. However, as described above, the assignment of phases to binary values can be switched.

In one embodiment, the memory sub-system 110 uses the electrodes of the phase change memory cell for determining a phase of the variable resistance material and thus determine a binary value represented by the current phase of the variable resistance material. For example, the electrodes of the phase change memory cell can be coupled to a selector and the selector can act as a switch to selectively allow a variable voltage across the variable resistance material. When the resistivity of the variable resistance material is high (i.e., the variable resistance material is in an amorphous phase), the voltage used must be sufficiently high to overcome the resistivity of the variable resistance material. If the voltage is not sufficiently high, current will not pass through the variable resistance material and the selector will snap back open. In contrast, when the variable resistance material has a lower resistivity (e.g., the variable resistance material is in a crystalline phase), the same voltage that was not able to pass through the variable resistance material when at a higher resistivity (e.g., the variable resistance material is in the amorphous phase) will pass through the variable resistance material without snapping the selector back open (i.e., the selector remains closed). Thus, applying a current with a specific voltage allows the phase of the variable resistance material to be determined such that data stored in or represented by the variable resistance material can be read.

Although the variable resistance material of a phase change memory cell is described above as being in one phase or another (e.g., metastable in an amorphous phase or a crystalline phase) and having a discrete resistivity while in that corresponding phase, the resistivity of the variable resistance material can be in constant transition or can be constantly drifting. Namely, the resistivity of the variable resistance material can vary (i.e., decelerate) over time as it attempts to settle. The rate of the change is highest when the variable resistance material is initially written to a particular phase and the rate of change is reduced over time until a constant rate of resistivity change is reached (e.g., after the passage of a few hundred seconds). The rate of resistivity change can be dependent on the phase of the variable resistance material. For example, when the variable resistance material of a phase change memory cell is in the crystalline phase (i.e., the phase change memory cell is set) the rate of resistivity change can be higher than when the variable resistance material is in the amorphous phase (i.e., the phase change memory cell is reset/unset).

Accordingly, the voltage applied by a selector of the phase change memory cell can need to be time-dependent (i.e., relative to the time from when the phase change memory cell was last written) to allow the phase of the variable resistance material to be determined while the resistivity of the variable resistance material is drifting. For example, three different voltage levels can be used to determine/read the phase of the variable resistance material, where each voltage level corresponds to a different time frame from when the variable resistance material was last written. A first voltage level can correspond to the time immediately after the variable resistance material was last written (i.e., time zero) until one-hundred seconds has elapsed, a second voltage level can correspond to one-hundred seconds until twelve hours has elapsed, and a third voltage level can correspond to twelve hours and onward. The time ranges/periods can be different than the examples set forth in this document and/or can be adjusted. In some embodiments, the lowest voltage level is used initially to reduce the probability that a read operation will affect the phase of the variable resistance material. In particular, as noted above, the variable resistance material can be coupled to a selector that is itself made from phase change material. Accordingly, the selector drifts in a similar fashion as the coupled variable resistance material. Increasing voltages with time is required to reach the threshold of this selector. However, increasing voltages also increases the current going through the variable resistance material and thus the amount of heat the variable resistance material receives. With a high enough voltage and with repetition, this can alter the state of the variable resistance material. The altered state can have a resistance that is indistinguishable as set or reset. As a result, a gentle approach is taken in which re-reads are performed with elevated voltages. If the controller 115 detects a valid codeword based on reading a set of phase change memory cells (e.g., utilizing a decoder and parity bits stored in the set of phase change memory cells), re-reads of the phase change memory cells with other voltage levels are not necessary. However, if a valid codeword is not determined, the next lowest/higher voltage level is utilized. This pattern continues until either a valid codeword is determined (utilizing parity bits were appropriate) or the voltage levels are exhausted without producing a valid codeword.

As noted above, although the phase of the variable resistance material of the phase change memory cell is metastable, the resistivity of the variable resistance material changes with time (i.e., the variable resistance material becomes more resistive). This change is more dramatic when the variable resistance material is in the crystalline phase (i.e., the variable resistance material is set) than when the variable resistance material is in the amorphous phase. Thus, the gap between the resistivities of the two phases/states is widening.

Based on the unequal, changing resistivity of the variable resistance material when in the amorphous and crystalline phases, determining a demarcation voltage (i.e., the voltage applied to a phase change memory cell to determine the state of the phase change memory cell) for reading the phase change memory cell is difficult and can be prone to error. This issue is particularly prevalent just after a phase change memory cell has been written (e.g., zero to one-hundred milliseconds after the phase of the variable resistance material has been altered) as the resistivity of the variable resistance material is at its highest level of transition/drift. As time elapses from the time the phase change memory cell was written, using a defined demarcation voltage is less prone to producing a read error.

To address the above issues, a set of data structures can be used for buffering/caching/storing user data that was recently written to phase change memory cells of the memory components 112A to 112N and/or parity bits associated with the user data. In some embodiments, a drift buffer with corresponding drift buffer content-addressable memory (CAM) are used, which are separate from a memory manager cache and corresponding memory manager cache CAM. In these systems, as write memory requests are received by the memory sub-system 110, these requests are stored in the memory manager cache with a corresponding entry in the memory manager cache CAM. Prior to writing user data to the memory components 112A to 112N based on these write requests, memory requests access the user data from the memory manager cache. Upon eviction from the memory manager cache and the memory manager cache CAM, user data from an evicted write request is written to the memory components 112A to 112N and entries are added to the drift buffer and drift buffer CAM. Accordingly, the user data is moved from the memory manager cache to the drift buffer. In this configuration, user data in the drift buffer is read instead of reading the user data directly from the memory components 112A to 112N while the corresponding phase change memory cells of the memory components 112A to 112N are still undergoing drift (e.g., during the first one-hundred milliseconds since writing the user data to the memory components 112A to 112N). As described above, in this technique, two separate storage spaces are used (e.g., the memory manager cache and the drift buffer) for storing user data corresponding to write requests during different periods of time. A similar set of data structures can also be used for repeated writes to the same phase change memory cells (e.g., a victim buffer and a victim buffer CAM). Use of multiple separate storage spaces results in needless overhead in both the physical presence of multiple separate storage spaces in the controller 115 and the transfers of user data between the storage spaces (e.g., transfer of user data from the memory manager cache to the drift buffer upon eviction from the memory manager cache and the cache CAM).

Figure 2:
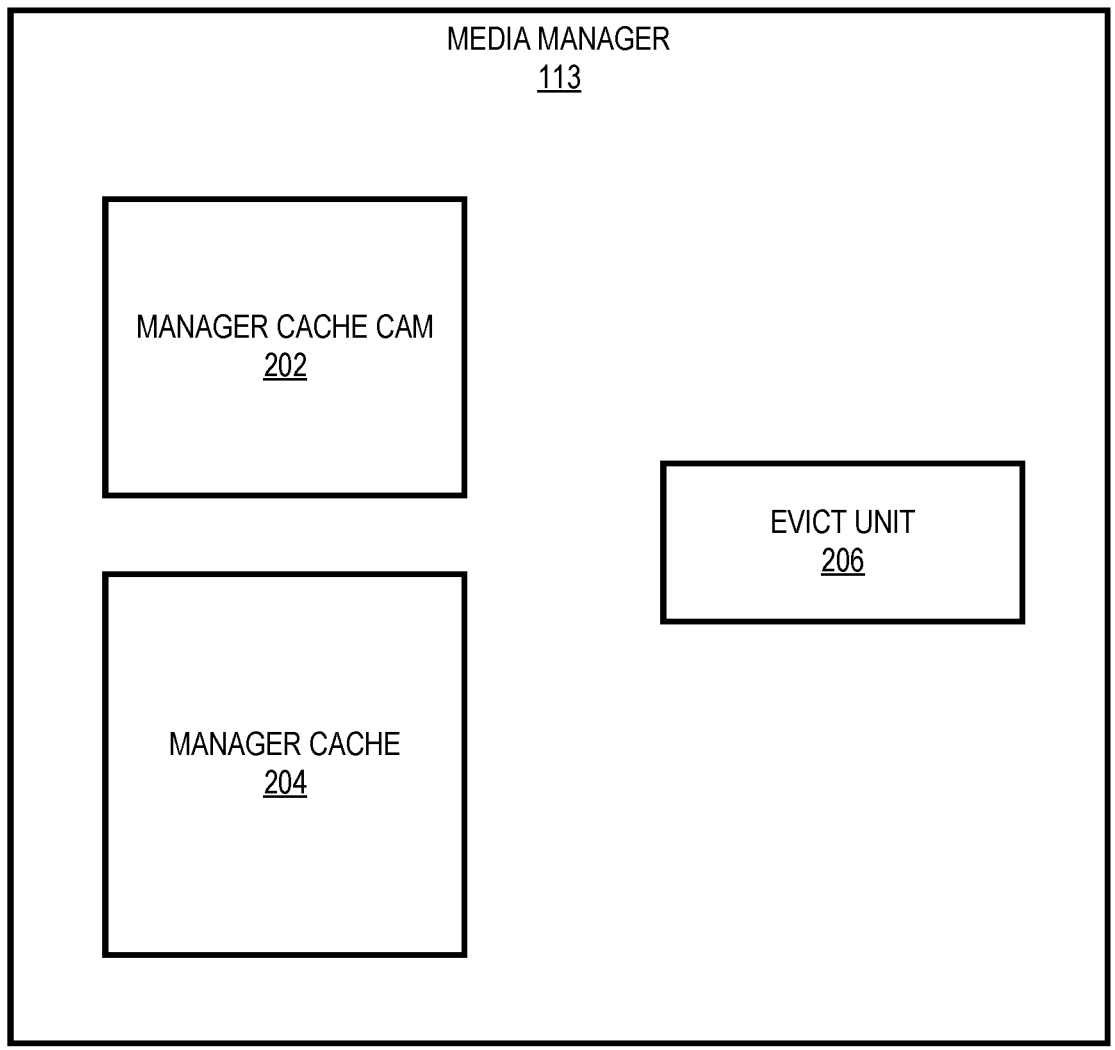
FIG. 2 illustrates a media manager, which includes a manager cache content-addressable memory (CAM), a manager cache, and an evict unit, in accordance with some embodiments of the present disclosure.
Figure 3:
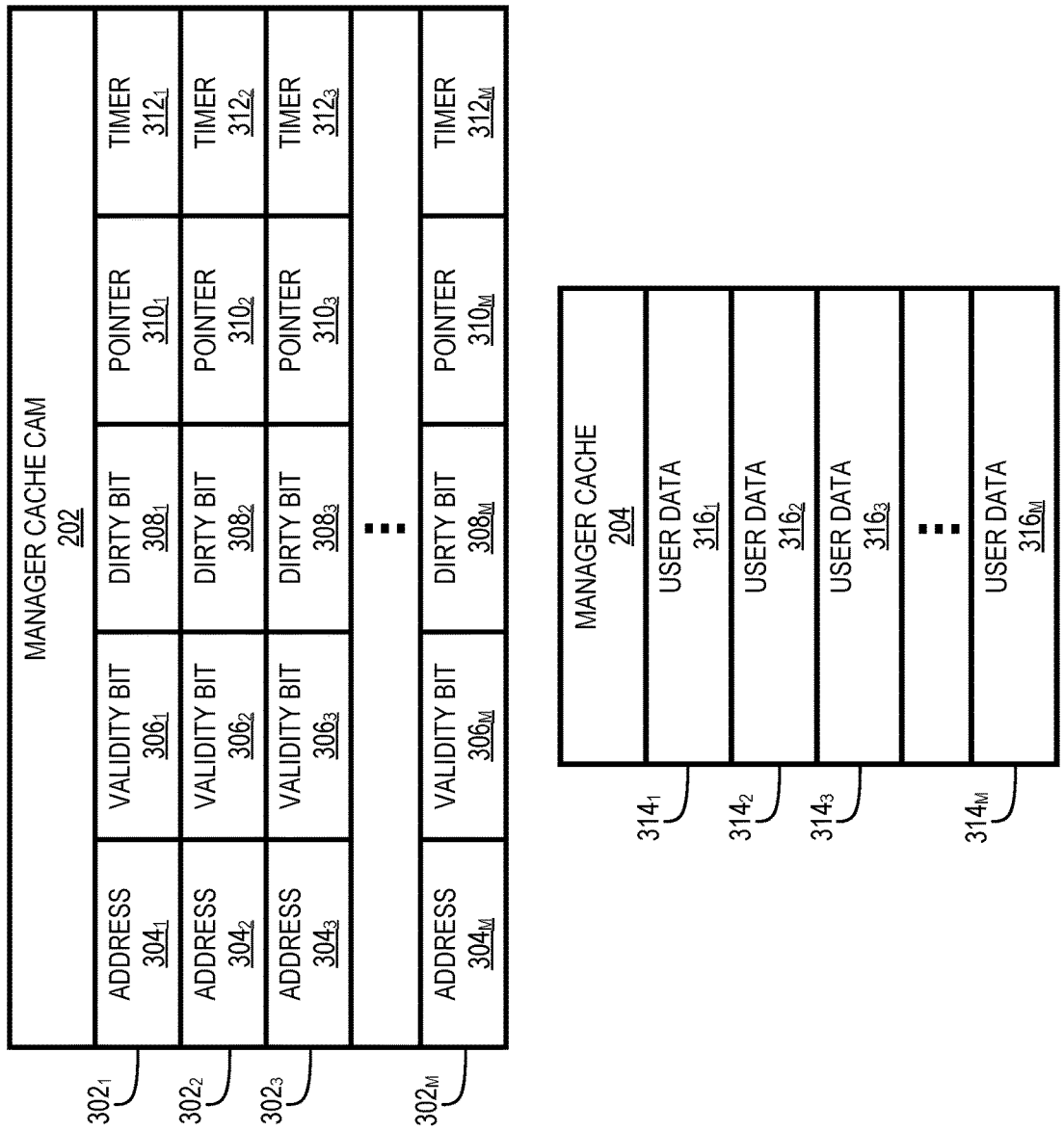
FIG. 3 presents an example manager cache CAM and a manager cache, in accordance with some embodiments of the present disclosure.

FIG. 2 illustrates a media manager 113 to address the above issues by including a timer in the media manager CAM 202 for each entry. In some embodiments, the media manager 113 includes a manager cache CAM 202, a manager cache 204, and an evict unit 206. In this configuration, as read and write requests are received by the media manager 113 from a host system 120, the manager cache CAM 202 creates corresponding entries in the manager cache CAM 202 with timer values. For example, FIG. 3 presents an example manager cache CAM 202 and a manager cache 204 according to one example embodiment. As shown, the manager cache CAM 202 includes a set of entries $302_1$-$302_M$ and the manager cache 204 includes an equal number of entries $314_1$-$314_M$. Each entry 302 in the manager cache CAM 202 includes an address 304, a validity bit 306, a dirty bit 308, a pointer 310, and a timer 312, while each entry 314 in the manager cache 204 includes user data 316. In this configuration, the address 304 corresponds to a logical address referenced by a host system 120, the validity bit 306 indicates whether the entry 302 is being used, the dirty bit 308 indicates whether corresponding user data 316 in the manager cache 204 has been written to the memory components 112A to 112N, and the pointer 310 indicates the location/entry 314 in the manager cache 204 where the user data 316 associated with the address 304 of the entry 302 is stored. Further, the timer 312 indicates whether (1) the evict unit 206 is to evict user data 316 from the manager cache 204 to the memory components 112A to 112N (e.g., when a dirty bit 308 is set and a timer 312 is before/less than the current time) and/or (2) the media manager 113 is to fulfill read requests for user data 316 received from a host system 120 using the memory components 112A to 112N (e.g., when a timer 312 is before/less than the current time) or are to be fulfilled using the manager cache 204 such that resistivity drift issues associated with recent writes/updates to the memory components 112A to 112N can be avoided. The media manager 113 will be described below in reference to the method 400 of FIG. 4.

Figure 4:
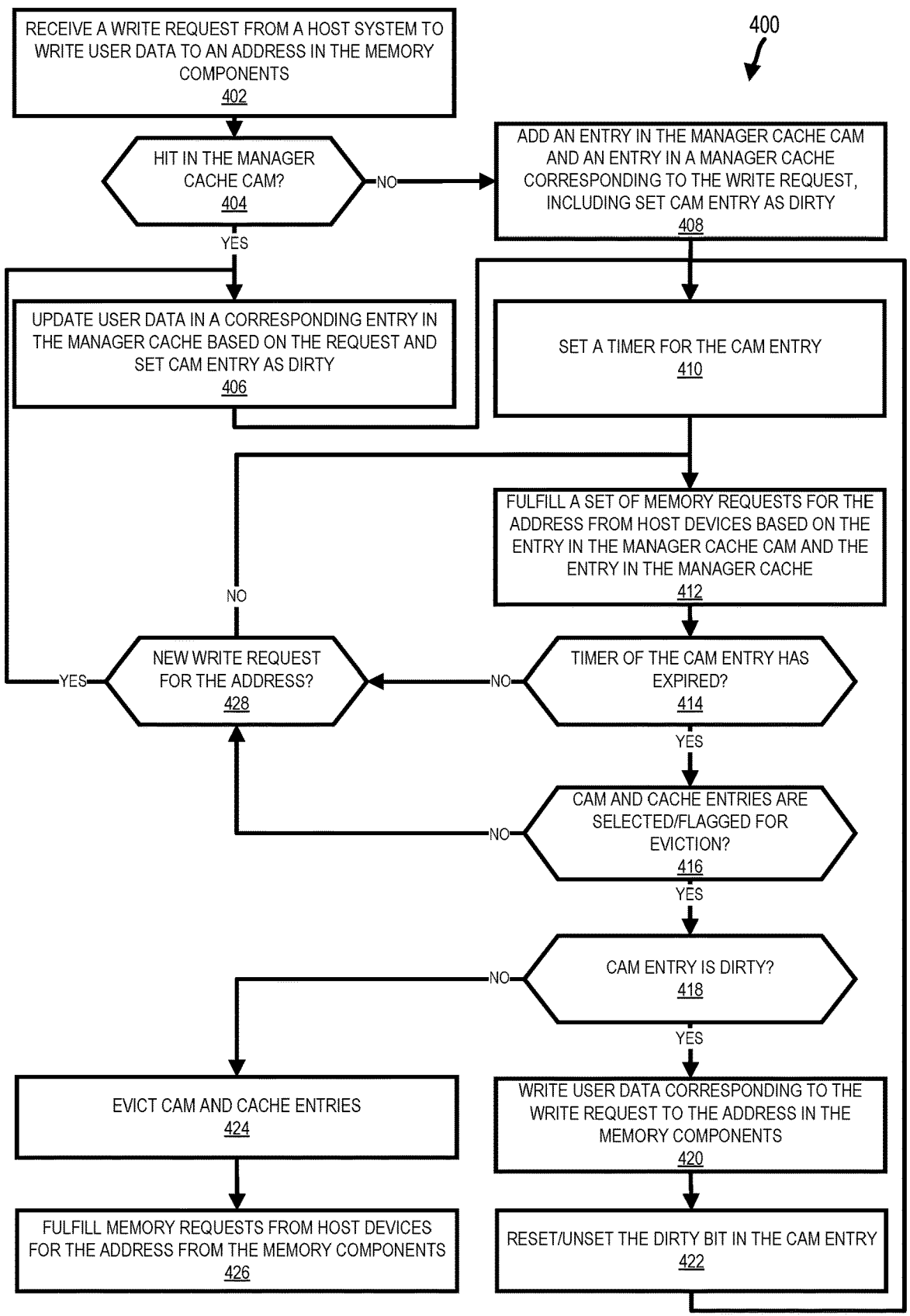
FIG. 4 is a flow diagram of an example method for caching memory requests while accounting for a phase change memory cell drift phenomenon, in accordance with some embodiments of the present disclosure.

FIG. 4 is a flow diagram of an example method 400 for caching memory requests while accounting for a phase change memory cell drift phenomenon, in accordance with some embodiments of the present disclosure. In particular, the method 400 maintains timer/timestamp values (e.g., the timer 312) in relation to user data 316 stored in a manager cache 204 and corresponding entries 302 in manager cache CAM 202. In this configuration, the timer values allow the manager cache 204 and manager cache CAM 202 to be used for fulfilling memory requests from host system 120 and accounting for a phase change memory cell drift phenomenon based on recent writes/rewrites to the memory components 112A to 112N while requiring only a single user data 316 storage space (i.e., only requires the manager cache 204). The method 400 can be performed by processing logic that can include hardware (e.g., a processing device, circuitry, dedicated logic, programmable logic, microcode, hardware of a device, integrated circuits, etc.), software (e.g., instructions run or executed on a processing device), or a combination thereof. In some embodiments, one or more of the operations of the method 400 is performed by the media manager 113 or one or more components of the media manager 113 of FIG. 1.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 400 commences at operation 402 with a processing device receiving from the host system 120 a request to write user data to an address in the memory components 112A to 112N. For example, the host system 120 transmits to the memory sub-system 110 a write request, which includes a logical address that maps to a physical address of the memory components 112A to 112N, and user data. As noted above, the memory components 112A to 112N can include phase change memory cells that are susceptible to resistivity drift.

Although described above as a logical address, the address of the received write request can be a logical address or a physical address of the memory components 112A to 112N. When the address of the write request is a logical address, an address translator of the controller 115 can translate the logical address to a physical address before eventually writing the user data to the memory components 112A to 112N.

At operation 404, the processing device determines whether there is a hit in the manager cache CAM 202. In particular, the processing device determines whether an address of the write request received from the host system 120 corresponds to an entry 302 in the manager cache CAM 202. For instance, when the address of the write request matches an address 304 of an entry 302 in the manager cache CAM 202, the processing device determines at operation 404 that a hit has occurred in the manager cache CAM 202 and the method 400 moves to operation 406. For example, when the address $304_3$ of the entry $302_3$ is identical to or is otherwise associated with the address of the write request received from the host system 120 at operation 402, the processing device determines a hit. Conversely, when no entries 302 in the manager cache CAM 202 include an address 304 that matches or is otherwise associated with the address of the write request received from the host system 120 at operation 402, the processing device determines a miss has occurred in the manager cache CAM 202 and the method 400 moves to operation 408.

At operation 406, when the processing device determines a hit in the manager cache CAM 202 based on the write request from the host system 120, the processing device updates the hit entry 302 in the manager cache CAM 202 and the corresponding entry 314 in the manager cache 204. For instance, in the example provided above, the processing device updates the entry $302_3$, including setting the dirty bit $308_3$ (e.g., the dirty bit $308_3$ is set to a value of "1" to indicate that the user data $316_2$ has not been written to the memory components 112A to 112N) and setting the user data $316_2$ of the entry $314_2$ in the manager cache 204 with the user data of the write request (i.e., copying the user data of the write request to the user data $316_2$ of the entry $314_2$). In this example, the pointer $310_3$ of the entry $302_3$ references/points to the entry $314_2$ (e.g., the pointer $310_3$ is set equal to "2" to reference the entry $314_2$). Following the processing device updating the hit entry $302_3$ in the manager cache CAM 202 and the corresponding entry $314_2$ in the manager cache 204, the method 400 moves to operation 410.

Returning to operation 404, as noted above, when the processing device determines a miss (i.e., no hit) in the manager cache CAM 202, the method 400 moves to operation 408. At operation 408, the processing device adds an entry 302 to the manager cache CAM 202 and an entry 314 to the manager cache 204 corresponding to the received write request. In particular, user data of the received write request is stored in a user data 316 field of an entry 314 of the manager cache 204 and an entry 302 is added to the manager cache CAM 202 that includes a pointer 310, which references/points to the added entry 314 in the manager cache 204. For example, through replacement or eviction, the entry $302_3$ and the entry $314_2$ are made available for the write request received at operation 402. Accordingly, the pointer $310_3$ can be set to point/reference the entry $314_2$ (e.g., the pointer $310_3$ is set equal to "2" to reference the entry $314_2$). The validity bit $306_3$ can be set to indicate that the entry $302_3$ is being used (e.g., the validity bit $306_3$ is set to a value of "1") and the dirty bit $308_3$ is set to indicate that the user data $316_2$ has not been written to the memory components 112A to 112N (e.g., the dirty bit $308_3$ is set to a value of "1").

The entry $302_3$ and the entry $314_2$, as described above in relation to operation 406 and operation 408, will be used as an example to describe the remainder of the method 400.

At operation 410, which can be arrived at after operation 406 or operation 408, the processing device sets the timer $312_3$ for the entry $302_3$. In one embodiment, the timer $312_3$ for the entry $302_3$ is set to the time when (1) the entry $302_3$ was added to the manager cache CAM 202 or (2) the entry $314_2$ was added to the manager cache 204. In another embodiment, the timer $312_3$ for the entry $302_3$ is set to the sum of (1) an expected write time and (2) the time when the entry $302_3$ was added to the manager cache CAM 202 or the entry $314_2$ was added to the manager cache 204. For example, the write time can be a preset time that is equal to two-hundred milliseconds such that the manager cache CAM 202 sets the timer $312_3$ to the sum of two-hundred milliseconds and one of: the time when the entry $302_3$ was added to the manager cache CAM 202 or the time when the entry $314_2$ was added to the manager cache 204.

At operation 412, the processing device fulfills any read requests, which include the address $304_3$, using the entry $302_3$ in the manager cache CAM 202 and the entry $314_2$ in the manager cache 204. For example, the host interface 121 receives a read request from a host system 120 and the host interface 121 decodes the read request to reveal the address $304_3$ (i.e., the host system 120 is requesting the user data $316_2$, which is associated with the address $304_3$). Since the user data $316_2$ has not yet been written to the memory components 112A to 112N (as indicated by the dirty bit $308_3$ being set and/or the timer $312_3$ not being expired), the processing device retrieves the user data $316_2$ using the pointer $310_3$ in the entry $302_3$ in the manager cache CAM 202 to read the user data $316_2$ from the entry $314_2$ in the manager cache 204 instead of reading the data $316_2$ from the memory components 112A to 112N. In later situations, as will be described in detail below, the processing device continues to read the user data $316_2$ from the entry $314_2$ in the manager cache 204 even after being written to the memory components 112A to 112N. For example, the user data $316_2$ is read from the manager cache 204 during a resistivity drift period both during an initial write of the memory components 112A to 112N and/or during a subsequent write/rewrite of the memory components 112A to 112N. In some embodiments, the entries $302_3$ and $314_2$ can be evicted and/or replaced following a resistivity drift period. However, as long as the entries $302_3$ and $314_2$ remain in the manager cache CAM 202 and the manager cache 204, respectively, the processing device can continue to read the user data $316_2$ from the entry $314_2$ in the manager cache 204 (even after the resistivity drift period) to fulfill read requests.

As used herein, reading user data 316 from the manager cache CAM 202 is based on checks with one or more fields of the manager cache CAM 202. For example, prior to reading user data 316 from the manager cache 204, the processing device checks the validity bit 306 of a corresponding entry 302 in the manager cache CAM 202 to determine if the user data 316 in an entry 314 of the manager cache 204 is valid. When the validity bit 306 of an entry 302 is set (e.g., has a binary value of "1"), the user data 316 in a corresponding entry 314 of the manager cache 204 is valid. Conversely, when the validity bit 306 of an entry 302 is unset/reset (e.g., has a binary value of "0"), the user data 316 in a corresponding entry 314 of the manager cache 204 is invalid. In this latter case, reading of the user data 316 returns an error, is delayed until the validity bit 306 is set, or read requests are fulfilled based on data stored in the memory components 112A to 112N (i.e., the resistivity drift period has ended and the entries 302 and 314 are no longer needed).

At operation 414, the processing device determines whether the timer $312_3$ of the entry $302_3$ has expired. For example, when the timer $312_3$ was set at operation 410 to be the time when the entry $302_3$ was added to the manager cache CAM 202 or the entry $314_2$ was added to the manager cache 204, the timer $312_3$ expires when the difference between the current time and the write time (e.g., two-hundred milliseconds) is equal to or greater than the timer $312_3$. In another example, when the timer $312_3$ was set at operation 410 to be the sum of (1) the write time and (2) the time when the entry $302_3$ was added to the manager cache CAM 202, the entry $314_2$ was added to the manager cache 204, or the user data of the write request written to the user data $316_2$, the timer $312_3$ expires when the current time is greater than or equal to the timer $312_3$.

Upon the processing device determining at operation 414 that the timer $312_3$ has not expired, the method 400 moves to operation 428 such that the processing device can determine if any new write requests for the address $304_3$ have been received, as discussed in greater detail below. In contrast, upon the processing device determining at operation 414 that the timer $312_3$ has expired, the method 400 moves to operation 416.

At operation 416, the processing device determines if the entry $302_3$ and/or the entry $314_2$ are flagged/selected to be evicted from the manager cache CAM 202 and the manager cache 204, respectively. For example, during another concurrent run of the method 400 for another write request corresponding to another address (e.g., an address other than the address $304_3$), the processing device determines at operation 404 a miss for this address in the manager cache CAM 202. As a result, the processing device determines that an oldest entry 302 in the manager cache CAM 202 and the corresponding entry 314 in the manager cache 204 need to be evicted to make room for entries 302 and 314 for the new write request. In this example, the entry $302_3$ is the oldest entry 302 in the manager cache CAM 202 and the entry $314_2$ is the oldest entry 314 in the manager cache 204 and both are flagged or otherwise selected for eviction. Accordingly, in this example situation, the processing device determines at operation 416 that the entries $302_3$ and $314_2$ are flagged/selected for eviction from the manager cache CAM 202 and the manager cache 204, respectively. Upon the processing device determining at operation 416 that the entry $302_3$ and the entry $314_2$ are not flagged/selected to be evicted from the manager cache CAM 202 and the manager cache 204, respectively, the method 400 moves to operation 428 such that the processing device can determine if any new write requests for the address $304_3$ have been received, as discussed in greater detail below. Conversely, upon the processing device determining at operation 416 that the entry $302_3$ and the entry $314_2$ are flagged/selected to be evicted from the manager cache CAM 202 and the manager cache 204, respectively, the method 400 moves to operation 418.

At operation 418, the processing device determines if the dirty bit $308_3$ is set (i.e., the entry $302_3$ and the entry $314_2$ are dirty). When the dirty bit $308_3$ is set, the corresponding user data $316_2$ of the entry $314_2$ has not been written to the memory components 112A to 112N. In contrast, when the dirty bit $308_3$ is unset/reset, the corresponding user data $316_2$ of the entry $314_2$ has been written to the memory components 112A to 112N. When the processing device determines that the dirty bit $308_3$ is set (i.e., the user data $316_2$ has not been written to the memory components 112A to 112N), the method 400 moves to operation 420.

At operation 420, the processing device writes the user data $316_2$ to the memory components 112A to 112N. In particular, the processing device passes the user data $316_2$ together with the address $304_3$ to the memory components 112A to 112N such that the memory components 112A to 112N write the user data $316_2$ to the location corresponding to the address $304_3$. Since the address $304_3$ is a logical address associated with a host system 120, address translation can be performed prior to writing the user data $316_2$ to the memory components 112A to 112N (i.e., a translation of the logical the address $304_3$ to a physical address of the memory components 112A to 112N). Writing the user data $316_2$ includes programming a set of phase change memory cells within the memory components 112A to 112N (e.g., setting or unsetting the phase change memory cells by altering the phase of the cells). Writing the user data $316_2$ to the memory components 112A to 112N is performed in addition to updating the entry $302_3$ in the manager cache CAM 202. For example, at operation 422 the processing device updates a dirty bit $308_3$ to indicate that the entry $302_3$ and corresponding user data $316_2$ are not dirty (i.e., set the dirty bit to a value of "0"). As noted above, a resistivity drift period can commence for phase change memory cells based on this write operation. Specifically, although the phase change memory cells of the memory components 112A to 112N can be programmed to be in a particular phase (e.g., an amorphous phase or a crystalline phase), determining the phase of these cells during the resistivity drift period can be difficult as the cells are in a high rate of resistivity transition.

To alleviate potential errors in reading the user data $316_2$ directly from the memory components 112A to 112N during the resistivity drift period, the processing device returns to operation 410 to set the timer $312_3$ for the entry $302_3$. In one embodiment, the timer $312_3$ for the entry $302_3$ is set to the time when writing the user data $316_2$ to the memory components 112A to 112N has completed or the time when writing the user data $316_2$ to the memory components 112A to 112N has commenced. In another embodiment, the timer $312_3$ for the entry $302_3$ is set to the sum of (1) a drift time and (2) the time when writing the user data $316_2$ to the memory components 112A to 112N has completed or the time when writing the user data $316_2$ to the memory components 112A to 112N has commenced. For example, the drift time can be a preset time that is equal to one-hundred milliseconds such that the timer $312_3$ is set to the sum of one-hundred milliseconds and one of the time when writing the user data $316_2$ to the memory components 112A to 112N has completed or the time when writing the user data $316_2$ to the memory components 112A to 112N has commenced.

In the example above, the write time, which can be used to set the timer $312_3$ at operation 410 prior writing the user data $316_2$ to the memory components 112A to 112N, is greater than the drift time, which was used to set the timer $312_3$ at operation 410 following writing the user data $316_2$ to the memory components 112A to 112N. However, in other embodiments, the write time can be greater than or equal to the drift time.

Returning to operation 418, when the processing device determines that the dirty bit $308_3$ is unset/reset (i.e., the user data $316_2$ is written to the memory components 112A to 112N), the method 400 moves to operation 424.

At operation 424, the processing device evicts the entry $302_3$ from the manager cache CAM 202 and the entry $314_2$ from the manager cache 204. Eviction of the entries $302_3$ and $314_2$ allows these entries 302 and 314 to be used for another address/write request. In one embodiment, the processing device evicts the entries $302_3$ and $314_2$ by resetting/unsetting the validity bit $306_3$ (i.e., setting the validity bit $306_3$ to a value of "0").

At operation 426, the processing device can fulfill read requests, which include the address of the original write request from operation 402, using the memory components 112A to 112N. In particular, instead of using the entry $302_3$ in the manager cache CAM 202 and the entry 314$_2$ in the manager cache 204 to fulfill a read request for the address of the original write request from operation 402, the processing device can read the corresponding user data directly from the memory components 112A to 112N. For example, the host interface 121 receives a read request from a host system 120 and the host interface 121 decodes the read request to reveal the address of the original write request from operation 402 (i.e., the host system 120 is requesting the user data that is associated with the address of the original write request from operation 402). Since this user data has been written to the memory components 112A to 112N and the resistivity drift period has expired (as determined at operation 414), the processing device retrieves the requested user data from the memory components 112A to 112N.

Returning to operation 428, upon the method 400 moving to operation 428 from operation 414 (i.e., the processing device determines that the timer 312$_3$ has expired) or from operation 416 (i.e., the processing device determines that the entry 302$_3$ and the entry 314$_2$ are not flagged/selected to be evicted from the manager cache CAM 202 and the manager cache 204, respectively), the processing device determines whether a new write request has been received with the address 304$_3$. When the processing device determines at operation 428 that a new write request with the address 304$_3$ has not been received, the method 400 moves back to operation 412 such that the processing device can fulfill one or more read requests, which include the address 304$_3$, using the entry 302$_3$ in the manager cache CAM 202 and the entry 314$_2$ in the manager cache 204.

In contrast, when the processing device determines at operation 428 that a new write request with the address 304$_3$ has been received, the method 400 moves to operation 406. At operation 406, the processing device updates that the entry 302$_3$, including the dirty bit 308$_3$, and the entry 314$_2$ with the new user data 316$_2$. The method 400 thereafter returns to operation 410 to set the timer 310$_3$ such that future read requests for the address 304$_3$ use the entry 302$_3$ in the manager cache CAM 202 and the entry 314$_2$ in the manager cache 204.

As described above, the use of timers in the media manager 113 allows the combination of a media manager cache, a drift buffer, and a victim buffer into a single set of data structures (e.g., the manager cache CAM 202 and the manager cache 204). The combination of a media manager cache, a drift buffer, and a victim buffer into a single set of data structures through the use of timer values, results in a reduced number of storage spaces and consequent transfers of user data to alleviate resistivity drift issues in phase change memory cells.

Figure 5:
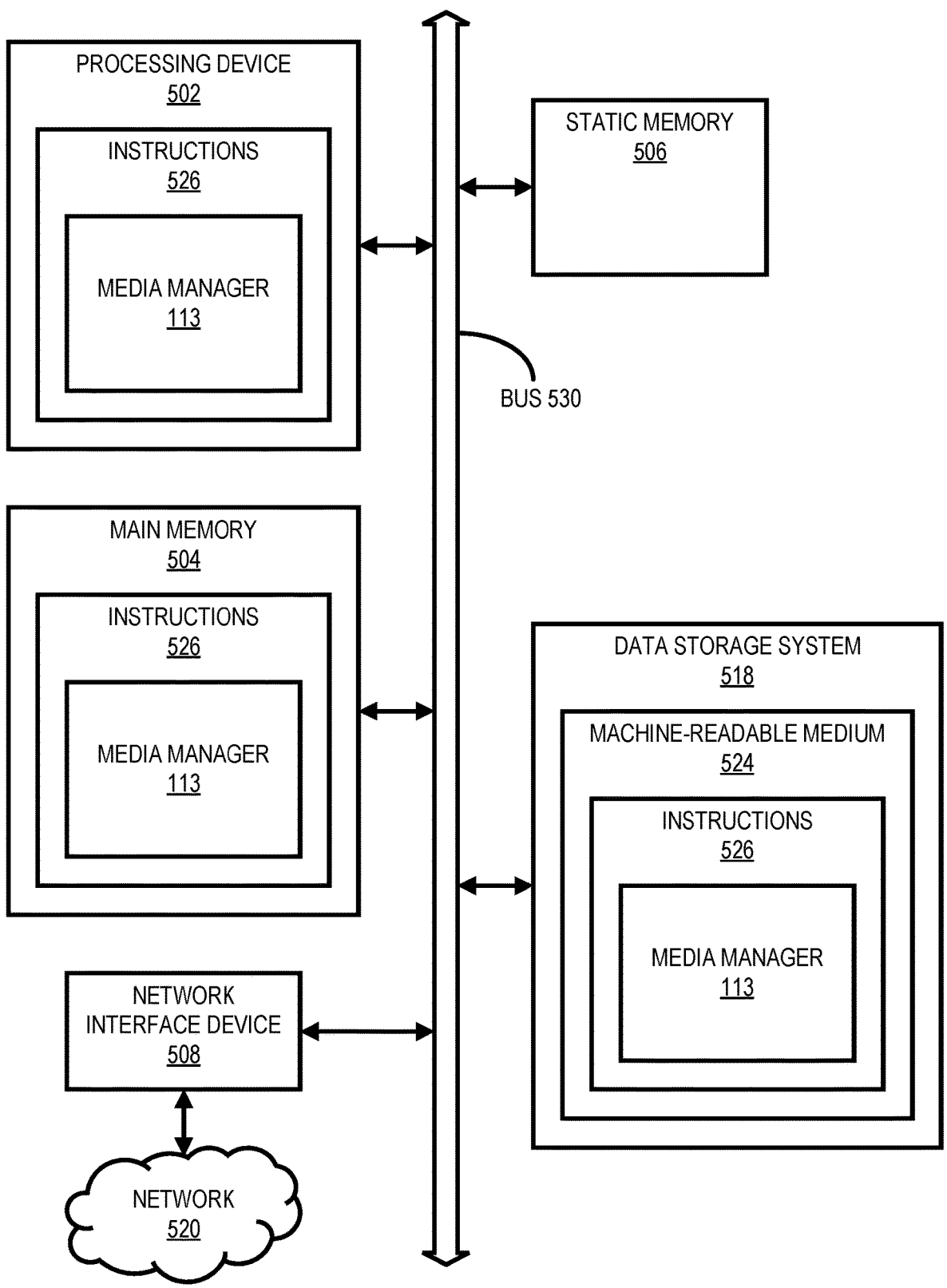
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a media manager (e.g., the media manager 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, can carry out the computer-implemented method 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method for caching memory requests while accounting for a phase change memory cell drift phenomenon, the method comprising:
    writing first user data to an address in phase change memory cells;
    setting a timer in a set of data structures to a first value in response to writing the first user data to the phase change memory cells, wherein the set of data structures are stored outside the phase change memory cells;
    determining whether the timer, corresponding to the first user data, has expired; and
    fulfilling a read request for the address from the set of data structures in response to determining that the timer has not expired.

2. The method of claim 1, further comprising:
    fulfilling the read request for the address from the phase change memory cells in response to determining that the timer has expired.

3. The method of claim 1, wherein the set of data structures comprise a content addressable memory (CAM) data structure that comprises a first set of entries and a cache data structure that comprises a second set of entries;
    wherein each entry in the first set of entries references a separate entry in the second set of entries;
    wherein an entry in the second set of entries comprises the first user data; and
    wherein an entry in the first set of entries comprises the address, a reference to the entry in the second set of entries, and the timer.

4. The method of claim 1, further comprising:
    receiving a first write request that comprises the first user data and the address;
    storing the first user data in the set of data structures in response to receiving the first write request for the first user data; and
    setting the timer to a second value in response to storing the first user data in the set of data structures.

5. The method of claim 4, further comprising:
    determining that the timer, set with the second value, has expired, wherein the writing the first user data to the address in the phase change memory cells is performed in response to determining that the timer, set with the second value, has expired.

6. The method of claim 5, further comprising:
    receiving a second write request that comprises second user data and the address;
    storing the second user data in the set of data structures in place of the first user data in response to receiving the second write request; and
    setting the timer to the second value in response to storing the second user data in the set of data structures.

7. The method of claim 6, wherein the first value is different from the second value.

8. A non-transitory computer-readable storage medium comprising instructions that, when executed by a processing device, cause the processing device to:
- set a timer in a set of data structures to a first value in response to writing first user data to an address in phase change memory cells, wherein the set of data structures are stored outside the phase change memory cells;
- determine whether the timer, corresponding to the first user data, has expired; and
- fulfill a read request for the address from the phase change memory cells in response to determining that the timer has expired.

9. The non-transitory computer-readable medium of claim 8, wherein the processing device is further to:
- fulfill the read request for the address from the set of data structures in response to determining that the timer has not expired.

10. The non-transitory computer-readable medium of claim 8, wherein the set of data structures comprise a content addressable memory (CAM) data structure that comprises a first set of entries and a cache data structure that comprises a second set of entries;
- wherein each entry in the first set of entries references a separate entry in the second set of entries;
- wherein an entry in the second set of entries comprises the first user data; and
- wherein an entry in the first set of entries comprises the address, a reference to the entry in the second set of entries, and the timer.

11. The non-transitory computer-readable medium of claim 8, wherein the processing device is further to:
- receive a first write request that comprises the first user data and the address;
- store the first user data in the set of data structures in response to receiving the first write request for the first user data; and
- set the timer to a second value in response to storing the first user data in the set of data structures.

12. The non-transitory computer-readable medium of claim 11, wherein the processing device is further to:
- determine that the timer, set with the second value, has expired, wherein the writing the first user data to the address in the phase change memory cells is performed in response to determining that the timer, set with the second value, has expired.

13. The non-transitory computer-readable medium of claim 12, wherein the processing device is further to:
- receive a second write request that comprises second user data and the address;
- store the second user data in the set of data structures in place of the first user data in response to receiving the second write request; and
- set the timer to the second value in response to storing the second user data in the set of data structures.

14. The non-transitory computer-readable medium of claim 13, wherein the first value is different from the second value.

15. A system comprising:
- a memory component; and
- a processing device, coupled to the memory component, configured to:
  - write first user data to an address in phase change memory cells;
  - set a timer in an entry in a content addressable memory (CAM) data structure of a set of data structures to a first value in response to writing the first user data to the phase change memory cells;
  - determine whether the timer corresponding to the first user data has expired; and
  - fulfill a read request for the address from an entry in a cache data structure of the set of data structures in response to determining that the timer has not expired, wherein the CAM data structure and the cache data structure are stored outside the phase change memory cells.

16. The system of claim 15, wherein the processing device is further configured to:
- fulfill the read request for the address from the phase change memory cells in response to determining that the timer has expired.

17. The system of claim 15, wherein the processing device is further configured to:
- receive a first write request that comprises the first user data and the address;
- store the first user data in the entry of the cache data structure in response to receiving the first write request for the first user data; and
- set the timer to a second value in response to storing the first user data in the set of data structures.

18. The system of claim 17, wherein the processing device is further configured to:
- determine that the timer, set with the second value, has expired, wherein the writing the first user data to the address in the phase change memory cells is performed in response to determining that the timer, set with the second value, has expired.

19. The system of claim 18, wherein the processing device is further configured to:
- receive a second write request that comprises second user data and the address;
- store the second user data in the entry of the cache data structure in place of the first user data in response to receiving the second write request; and
- set the timer to the second value in response to storing the second user data in the cache data structure of the set of data structures.

20. The system of claim 19, wherein the first value is different from the second value.

\* \* \* \* \*